US008589776B2

(12) United States Patent
Calvignac et al.

(10) Patent No.: US 8,589,776 B2
(45) Date of Patent: Nov. 19, 2013

(54) TRANSLATION BETWEEN A FIRST COMMUNICATION PROTOCOL AND A SECOND COMMUNICATION PROTOCOL

(75) Inventors: Jean L. Calvignac, Raleigh, NC (US); Daniel G. Eisenhauer, Austin, TX (US); Ashish A. More, Banglore (IN); Anil Pothireddy, Bangalore (IN); Christoph Raisch, Gerlingen (DE); Saravanan Sethuraman, Bangalore (IN); Vibhor K. Srivastava, Sitapur (IN); Jan-Bernd Themann, Tuebingen (DE)

(73) Assignee: International Business Machines Corporation, Armonk, NY (US)

( * ) Notice: Subject to any disclaimer, the term of this patent is extended or adjusted under 35 U.S.C. 154(b) by 225 days.

(21) Appl. No.: 13/150,486

(22) Filed: Jun. 1, 2011

(65) Prior Publication Data

US 2011/0302481 A1    Dec. 8, 2011

(30) Foreign Application Priority Data

Jun. 4, 2010    (EP) .................................... 10305593

(51) Int. Cl.
*G06F 11/10*    (2006.01)
(52) U.S. Cl.
USPC ............. 714/807; 714/758; 398/45; 709/220; 709/230; 370/254; 370/389; 370/242; 370/255; 370/392; 370/395.3; 370/218

(58) Field of Classification Search
None
See application file for complete search history.

(56) References Cited

U.S. PATENT DOCUMENTS

| | | | | |
|---|---|---|---|---|
| 5,943,481 | A | * | 8/1999 | Wakeland ..................... 709/230 |
| 7,548,983 | B2 | * | 6/2009 | Przybylski et al. ............ 709/230 |
| 2004/0062267 | A1 | * | 4/2004 | Minami et al. ................ 370/463 |
| 2009/0034522 | A1 | | 2/2009 | Hayes et al. |
| 2009/0052346 | A1 | | 2/2009 | Brown et al. |
| 2009/0052461 | A1 | * | 2/2009 | Brown et al. ................. 370/401 |
| 2009/0245791 | A1 | * | 10/2009 | Thaler et al. .................... 398/45 |

* cited by examiner

*Primary Examiner* — John Trimmings
(74) *Attorney, Agent, or Firm* — Brandon C. Kennedy; Cynthia G. Seal; Biggers & Ohanian, LLP

(57) ABSTRACT

Translating between a first communication protocol used by a first network component and a second communication protocol used by a second network, where translating includes: receiving, by a network engine adapter operating independently from the first and second network components, data packets from the first and second network components; and performing, by the network engine, a combined communication protocol based on the first communication protocol and the second communication protocol, including manipulating data packets of at least one of the first communication protocol or the second communication protocol, thereby offloading performance requirements for the combined communication protocol from the first and second network components.

12 Claims, 8 Drawing Sheets

TRANSLATION BETWEEN A FIRST COMMUNICATION PROTOCOL AND A SECOND COMMUNICATION PROTOCOL

CLAIM OF PRIORITY

This application claims priority under 35 U.S.C. §119 to European Patent Application No. 10305593 filed Jun. 4, 2010, the entire text of which is specifically incorporated by reference herein.

BACKGROUND OF THE INVENTION

1. Field of the Invention

The field of the invention is data processing, or, more specifically, methods, apparatus, and products for translating between a first communication protocol and a second communication protocol.

2. Description of Related Art

Ethernet protocol refers to one type of network system protocol that a local area network (LAN) may employ. A conventional specification for a LAN often employs Ethernet protocols. The Ethernet standard provides the hardware and software interfaces for network devices in a network system. Ethernet also provides for connection of a network system to the Internet via a cable modem, a DSL modem, or other communications interface. The IEEE 802.3 standard defines the basic structure and protocol of Ethernet network systems. A network fabric is the physical infrastructure of a network that enables the connection of one network device to another network device. Network fabrics typically include connective cabling such as twisted pair wiring, coaxial cable, fiber optic cable or other connectivity structures. Network fabrics may also include network switches, network routers, network hubs and other connective network devices that share a common bandwidth and network protocol such as Ethernet, Fiber Channel, or other network protocol.

Ethernet network devices transmit data with Ethernet frames that are commonly known as Ethernet data packets. Ethernet data packets are variable length data transmissions that typically exhibit lengths from 72 to 1518 bytes or longer jumbo frames. Each Ethernet data packet includes a header with the addresses of the source and destination network devices, a data area, and a trailer that includes error correction data. Other network protocols such as IP (Internet Protocol) and IPX (Internetwork Packet EXchange) may fragment longer data transmissions through special use of Ethernet frames or data packets. In a similar process, Fiber Channel frames or data packets provide the data transmission mechanism for the Fiber Channel protocol. Fiber Channel is currently a multi-gigabit network technology that network systems employ primarily for use by storage devices. Fiber Channel is a standard in the T11 Technical Committee of the International Committee for Information Technology Standards (INCITS) and the American National Standards Institute (ANSI). Despite the name, Fiber Channel signals may operate over copper wire as well as fiber optic cables. Fiber Channel Protocol (FCP) is the interface protocol of the Small Computer System Interface (SCSI) in a Fiber Channel network system.

One problem that exists when supporting multiple network protocols in a server is a connectivity issue between a server and other network devices such as a client. A server requires multiple adapter types and cabling to handle each network protocol type. This multiple protocol network system requires the use of different fabric managers for each protocol type as well. In other words, if a server in a network system employs both Ethernet and Fiber Channel protocols, the server typically requires an Ethernet adapter and a Fiber Channel adapter, as well as respective fabric managers for each protocol. Such a server may also require respective cabling for the Ethernet adapter and the Fiber Channel adapter.

Fiber Channel over Ethernet (FCoE) is a protocol for tunneling Fiber Channel (FC) frames over Ethernet frames. It is a new approach towards I/O consolidation by preserving all FC constructs, maintaining the same latency, security and traffic management attributes of FC. Data centers typically configure their servers with a pair of FC Host Bus Adapters (HBA) and two or more Ethernet Network Interface Cards (NIC), but with FCoE support, they can now be converged in to a single adapter. FCoE enables the consolidation of both SAN's and Ethernet traffic onto a converged network adapter (CAN), thereby reducing the number of adapters, cables and power consumption.

There are multiple ways to implement FCoE on a system. The easiest way is to have a PCIe to FCoE adapter card added to the system. However this implementation is expensive, since there is a need to buy a new card, and will consume some portion of the PCIe bandwidth.

Another solution could be to replace the existing NIC (Ethernet card) with a Converged Enhanced Ethernet card and implement the FCoE stack in software. This method also adds cost in replacing the NIC with a CEE card and will use up a large amount of Processor bandwidth and can impact the performance of the system.

In the Patent Application Publication US 2009/0034522 A1 "Transporting Fiber Channel over Ethernet" by Hayes et al. a method of converting the Ethernet adapter to the FCoE adapter by reusing the existing Ethernet adapter card and adding a FPGA (Field Programmable Gate Array) as a hardware assist engine for implementing FCoE is disclosed. Fiber Channel data comprises Fiber Channel data frames, primitive signals and primitive sequences. Transporting Fiber Channel data over Ethernet enables existing Ethernet equipment including Ethernet switches and Ethernet network interface cards (NICs) to connect to, communicate with and provide services for SANs that are based on Fiber Channel technology or have Fiber Channel interfaces. All of the above can be accomplished by using an apparatus that transforms Fiber Channel data into Ethernet frames and vice-versa. This apparatus is called a Fiber Channel over Ethernet Transformer (FCOE Transformer). Methods of implementing the FCoE Transformer include using independent Ethernet and Fiber Channel interfaces connected by a network processor, by using a Field Programmable Gate Array (FPGA), by using a special purpose ASIC, by software running on a Ethernet or Fiber Channel connected device, by hardware state machines, or by a combination of hardware and software. The FCoE Transformer can be placed on an Ethernet NIC, in an Ethernet MAC, in an Ethernet switch, in a Fiber Channel switch, in a Fiber Channel HBA, or any place in between a Fiber Channel device and an Ethernet device.

In the Patent Application Publication US 2009/0245791 A1 "Method and System for Fiber Channel and Ethernet Interworking" by Thaler et al. a method of reusing an existing Ethernet adapter card and embedding a Fiber Channel (FC) processor as an integrated chip in the Ethernet card for the FCoE implementation is disclosed. A network switch may be operable to perform Ethernet switching operations between a plurality of clients and server. The network switch may enable level 2 (L2) switching operations, for example. The network switch may be coupled to a host via a PCI root complex. The network switch may comprise one or more Ethernet ports, a MAC, a processor, a memory, a server provided MAC addressing (SPMA) table, an FC processor, and a plurality of FC ports. The processor and the FC processor may be a separate integrated chip embedded on a motherboard or may be embedded in a NIC. The FC processor may comprise suitable logic, interfaces, code, and/or one or more circuits that may be operable to receive and/or communicate FC packets via the plurality of FC ports from/to one or more FC switches, for example, FC switch via the Fiber Channel fabric. The FC processor may be operable to encapsulate FC packets into FCoE packets and/or encapsulate FCoE packets into FC packets.

In the Patent Application Publication US 2009/0052346 A1 "Method and Apparatus for Enabling an Adapter in a Network Device to Discover the Name of another Adapter of another Network Device in a Network System" by Brown et al. a network protocol translation between Ethernet and FCoE (CEE) via a FCoE bridge is disclosed. A method of positioning the FCoE Bridge in between server NIC and Ethernet switch adapter is also disclosed. Communication or transfer of network data from Fiber Channel devices such as Fiber Channel adapter to Ethernet devices such as enhanced Ethernet adapter requires Fiber Channel to Ethernet data packet translation. Here the FCoE Bridge acts as the translation mechanism for the transfer of data between Fiber Channel protocol and Ethernet protocol network data structures. The FCoE Bridge provides translation from Fiber Channel to Ethernet protocols in one direction. The FCoE bridge also provides translation in the opposite direction, namely from Ethernet to Fiber Channel protocols.

SUMMARY OF THE INVENTION

Methods, network engine adapters, and products for translating between a first communication protocol used by a first network component and a second communication protocol used by a second network are disclosed that include receiving, by a network engine adapter operating independently from the first and second network components, data packets from the first and second network components; and performing, by the network engine, a combined communication protocol based on the first communication protocol and the second communication protocol, including manipulating data packets of at least one of the first communication protocol or the second communication protocol, thereby offloading performance requirements for the combined communication protocol from the first and second network components.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
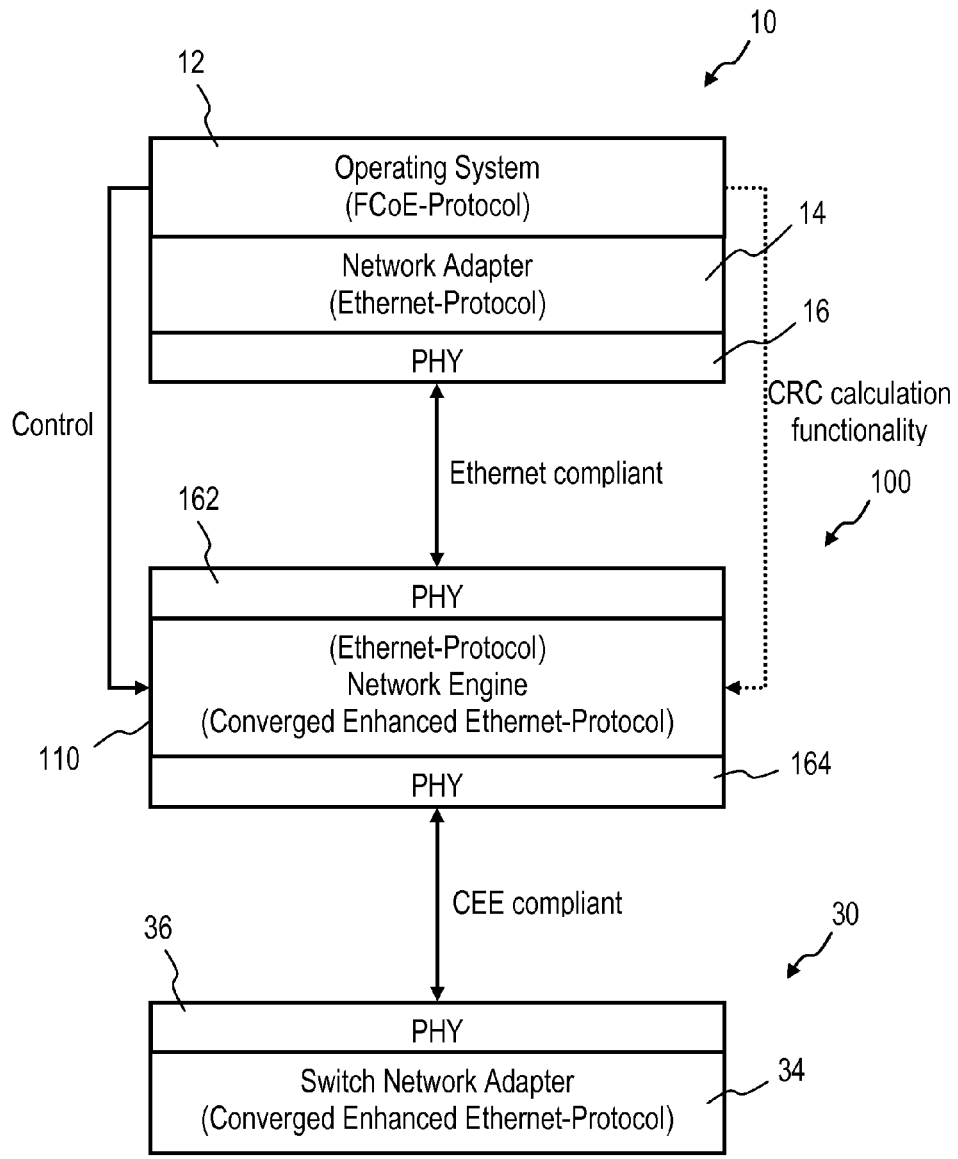
FIG. 1 is a schematic block diagram of a computer network providing at least two network component and at least one network engine adapter, in accordance with an embodiment of the present invention.

FIG. 1 depicts a computer network providing at least a first network component 10 comprising an operating system 12, a network adapter 14 and a port 16 using a first communication protocol (Ethernet) and a second network component 30 comprising a switch network adapter 34 and a port 36 using a second communication (Converged Enhanced Ethernet (CEE)) protocol. A network engine adapter 100 with a first port 162 connected to the port 16 of the first network component 10 and a second port 164 connected to the port 36 of the second network component 30 is arranged in a communication path between the first network component 10 and the second network component 30 to translate between the first communication protocol (Ethernet) and the second communication protocol (CEE) by manipulating data packets of the first communication protocol (Ethernet) and/or the second communication protocol (CEE). According to the present invention the network engine adapter 100 is operable as independent network component and performs offload functionality for a combined communication (Fiber Channel over Ethernet (FCoE)) protocol based on the first communication protocol (Ethernet) and the second communication protocol (CEE).

Referring to FIG. 1 the shown embodiment of the invention employs the network engine adapter 100 being implemented as independent device. Alternatively the network engine adapter 100 can be implemented as part of the first network component 10 or as part of the second network component 30. Further the network adapter 14 as part of the first network component 10 is performing an Ethernet Protocol and the switch network adapter 34 as part of the second network component 30 is performing a Converged Enhanced Ethernet (CEE) Protocol, wherein the network engine adapter 100 is performing offload functionality for a Fiber Channel over Ethernet (FCoE) Protocol. The network engine adapter 100 is implemented as Field Programmable Gate Array (FPGA), for example.

The Fiber Channel over Ethernet (FCoE) Protocol requires the extended Ethernet protocol called Converged Enhanced Ethernet (CEE) protocol. The CEE-protocol defines new packet format of "pause frames" for flow control. Usual 10 Gigabit Ethernet cards do not support the CEE-protocol and thus cannot be used in FCoE (CEE) fabrics. Also the FCoE-Protocol defines checksum for FC packets in an Ethernet frame on top of the Ethernet checksum, wherein the calculation of this Cyclic Redundancy Check (CRC) data consumes a lot CPU power within the operating system if not calculated in the network engine adapter 100.

Figure 4:
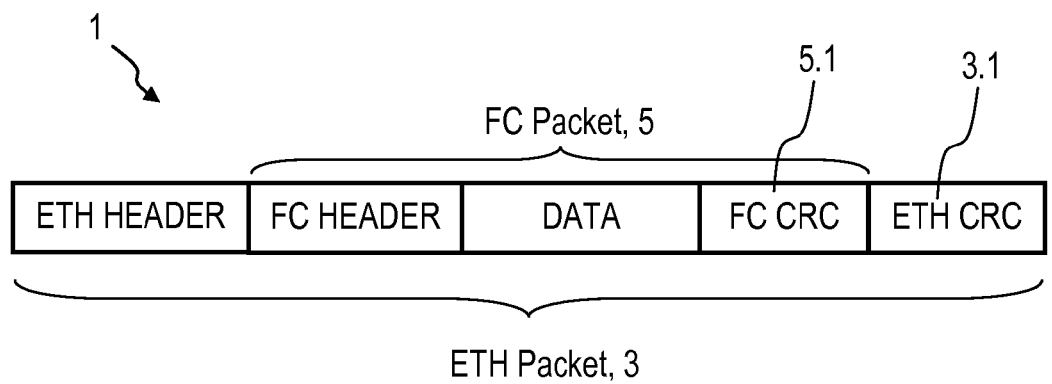
FIG. 4 is a data packet of a combined communication protocol.

FIG. 4 shows a data packet 1 of a combined communication protocol here the FCoE-Protocol. Referring to FIG. 4 a data packet 5 of the CEE-Protocol comprising a FC header, data and FC CRC data 5.1 is embedded in a data packet 3 of the Ethernet-Protocol comprising an ETH header, the data packet 5 as data part and ETH CRC data 3.1.

Embodiments of the present invention comprise an efficient way to reuse the existing server/system resources by implementing the FCoE-Protocol by using the network engine adapter 100, that assist in converting the standard Ethernet card into a CEE compatible Ethernet card, offloading all the compute intense FCoE tasks and freeing-up the processor load.

The network engine adapter 100 is placed in the network before the server equipment 10, and is used to monitor the network traffic and performs the hardware assist roles when needed. The network engine adapter 100 is transparent to the network 30 and acts as a delay element in the line. So embodiments of the present invention reuse the existing Ethernet Adapter card and add an FPGA as network engine adapter 100 for the FCoE implementation. So a usual 10 Gigabit Ethernet NIC is enabled for the FCoE-Protocol. From switch 34 point of view, the NIC of the server 10 is made compliant to the CEE-Protocol without changing the existing network chip. Also offload functionality for CRC-calculation of FCoE-Protocol checksum is provided without changing the existing network chip. The network engine adapter 100 comprises a network engine 110 which is controlled and configured by operating system 12 and/or firmware. The network engine 110 is manipulating data packets 3, 5 to translate between the Ethernet-Protocol and the CEE-Protocol to allow the server 10 to participate in the CEE network 30. Additionally the network engine 110 is performing offload functionality for the FCoE-Protocol "in the wire" to reduce CPU load of the first network component (server) 10. The position of the network engine adapter 100 in the communication path is flexible as described above.

Using FPGA based network engine adapters 100 is allowing advantageously that the FCoE and CEE functions are enabled on the server 10 without the need for any extra cards. The network engine adapter 100 can offload the CRC computation load for Fiber Channel (FC) and/or Ethernet from the processor by modifying the device driver not to do the Fiber Channel CRC calculation and instead to recognize a specific value in the CRC field deposited by the network engine 110 during outbound data flow, and should not generate Fiber Channel CRC but leave the CRC byte space in the frame during inbound data flow.

Figure 2:
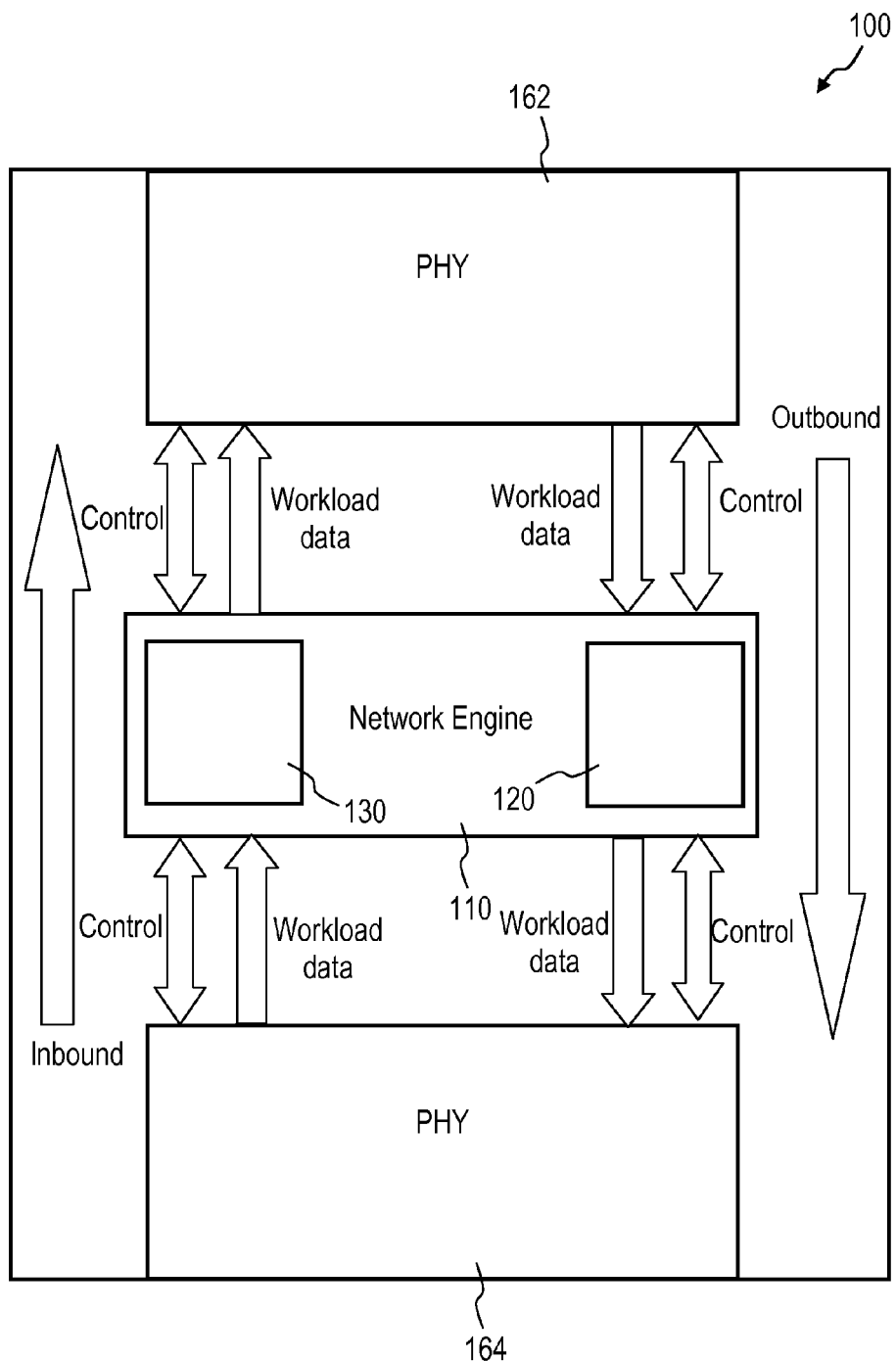
FIG. 2 is a schematic block diagram of the network engine adapter of FIG. 1, in accordance with an embodiment of the present invention.
Figure 3:
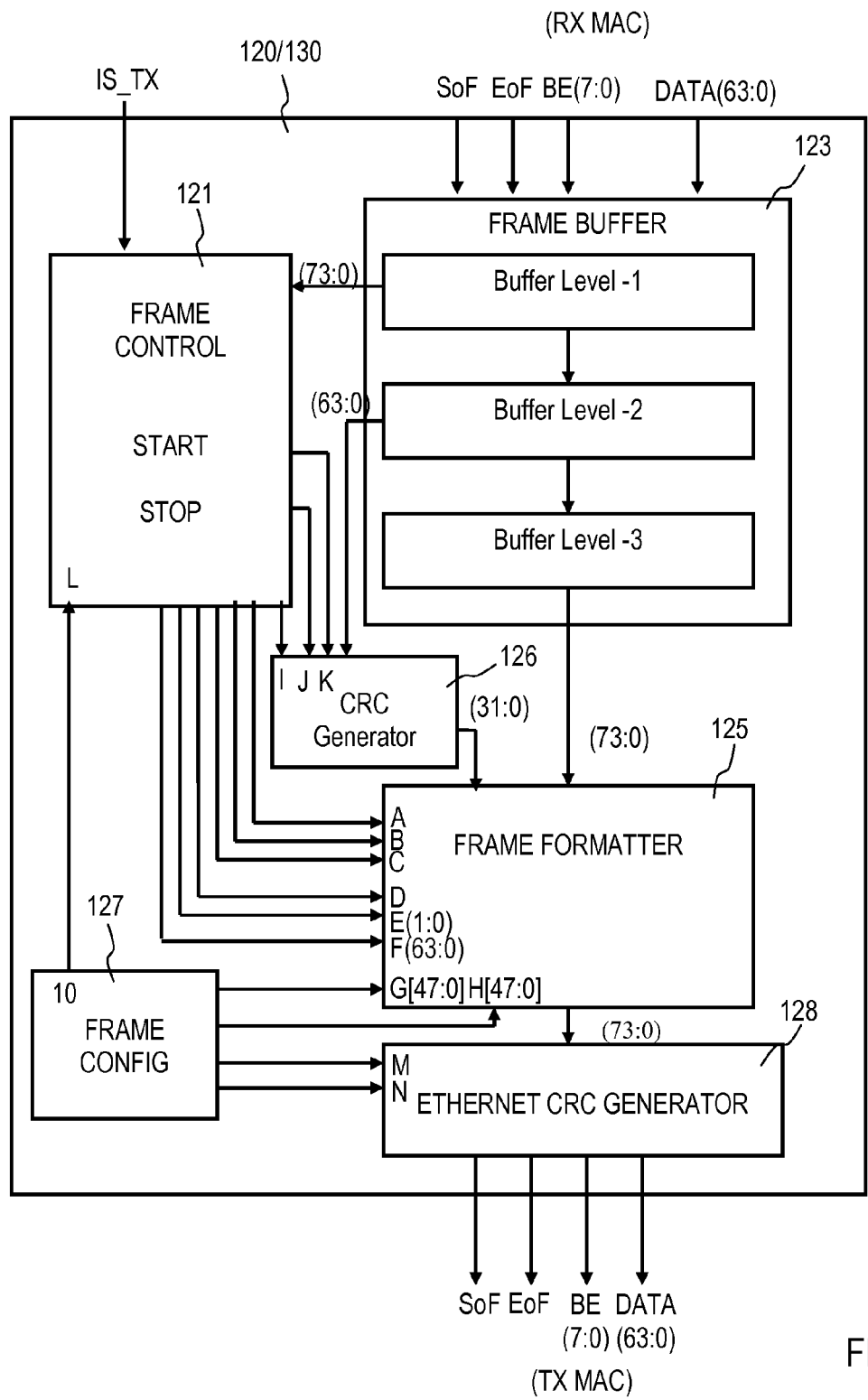
FIG. 3 is a schematic block diagram of an Inbound/Outbound Logic for the network engine adapter of FIG. 2, in accordance with an embodiment of the present invention.

FIG. 2 is a network engine adapter 100, in accordance with an embodiment of the present invention; and FIG. 3 is an inbound/outbound logic 120, 130 for the network engine adapter 100 of FIG. 2, in accordance with an embodiment of the present invention.

Referring to FIGS. 2 and 3 a brief description of the architecture of the network engine adapter 100 is given. The data traffic of the FCoE- or Ethernet-Protocol is first passed through the Ethernet port 162, comprising XAUI lanes and MAC IP, for example, for processing the serial bit stream data into a parallel format, so that it eases the formatting in the network engine 110.

The outbound logic 120 and inbound logic 130 processes the outgoing and incoming data 3, 5 respectively and the data is passed through the Fiber Channel port 164, comprising MAC and XAUI lanes again to convert back to the serial format. XAUI and MAC are available as reusable IP and should be easy to integrate. The outbound logic 120 and inbound logic 130 comprise of the custom design logic need to implement the CEE- and FCoE-Protocol support.

FIG. 3 shows a preferred embodiment for implementing the outbound logic 120 and/or inbound logic 130 and there could be several similar alternatives for implementing the same architecture within the scope of this invention. To simplify matters, in the following only an outbound logic 120 is described. The outbound logic 120 comprises a frame control unit 121, a frame buffer 123, a frame formatter 125, a first CRC generator 126 (Fiber Channel CRC generator), a frame configuration unit 127 and a second CRC generator 128 (Ethernet CRC generator).

The frame control unit 121 as the name suggests is responsible for detecting the frame type and generating the command signals as listed in Table 1 for formatting the frames being processed. The frame control unit 121 is responsible for a pause frame conversion too. So the frame control unit 121 performs the pause frame conversion where a pause frame of the first communication protocol (Ethernet) is translated to a pause frame of the second communication protocol (CEE) in case of a outbound data flow or the pause frame of the second communication protocol (CEE) is translated to a pause frame of the first communication protocol (Ethernet) in case of a inbound data flow.

The frame buffer 123 implements a pipelining for the data path and gives enough time for the frame control unit 121 to issue the commands and also for the first CRC generator to compute the CRC data of the Fiber Channel data.

The frame formatter 125 gets the data from the frame buffer 123 and the control instructions from the frame control unit 121 and acts accordingly.

The first CRC generating unit 126 computes and inserts Cyclic Redundancy Check (CRC) data 5.1 for the second communication protocol (CEE) in case of the outbound logic 120, and/or checks the Cyclic Redundancy Check (CRC) data 5.1 in case of a inbound logic 130, wherein the first CRC generating unit 126 inserts patterns indicating a first condition, representing good Fiber Channel CRC data 5.1, or a second condition, representing wrong Fiber Channel CRC data 5.1.

The frame configuration unit 127 is a programmable interface and provides a means to configure and program the network engine 110 and also to enable debug features if required.

The second CRC generator 128 is an optional block that is used to keep the whole design transparent to the system. Should there be an indication that the received Ethernet CRC data is corrupt the network engine 110 with the help of this second CRC generator 128 will corrupt the CRC data on the transmitted frame also.

TABLE 1

| Command | Meaning |
| --- | --- |
| IS_TX | '1' → Instance is a TX; '0' → Instance is a RX |
| A | Insert the Destination MAC address |
| B | Insert the Pause frame MAC address |
| C | Insert the FC-CRC Generated |
| D | Check FC-CRC and Insert corresponding Pattern |
| E | WRITE ENABLE (1:0); "00" → No Write; "01" → Write in data location (31:0); "10" → Write in data location (63:32); "11" → Enable for Pause frame Data |
| F | Pause frame data to be inserted (63:0) |

TABLE 1-continued

| Command | Meaning |
| --- | --- |
| G | Destination MAC Address |
| H | MAC Address for pause frame |
| I | Location Signal for asserting Start/Stop. '0' 8 byte boundary '1' 4 byte boundary |
| J | FC-CRC Start |
| K | FC-CRC Stop |
| L | FPGA configuration Register |
| M | Do not corrupt Eth-CRC on crc_error indication from rx_mac. |
| N | Do not update the Eth-CRC field with the computed CRC. |
| P | Always corrupt Eth-CRC on crc_error indication from rx_mac. |

Figure 5:
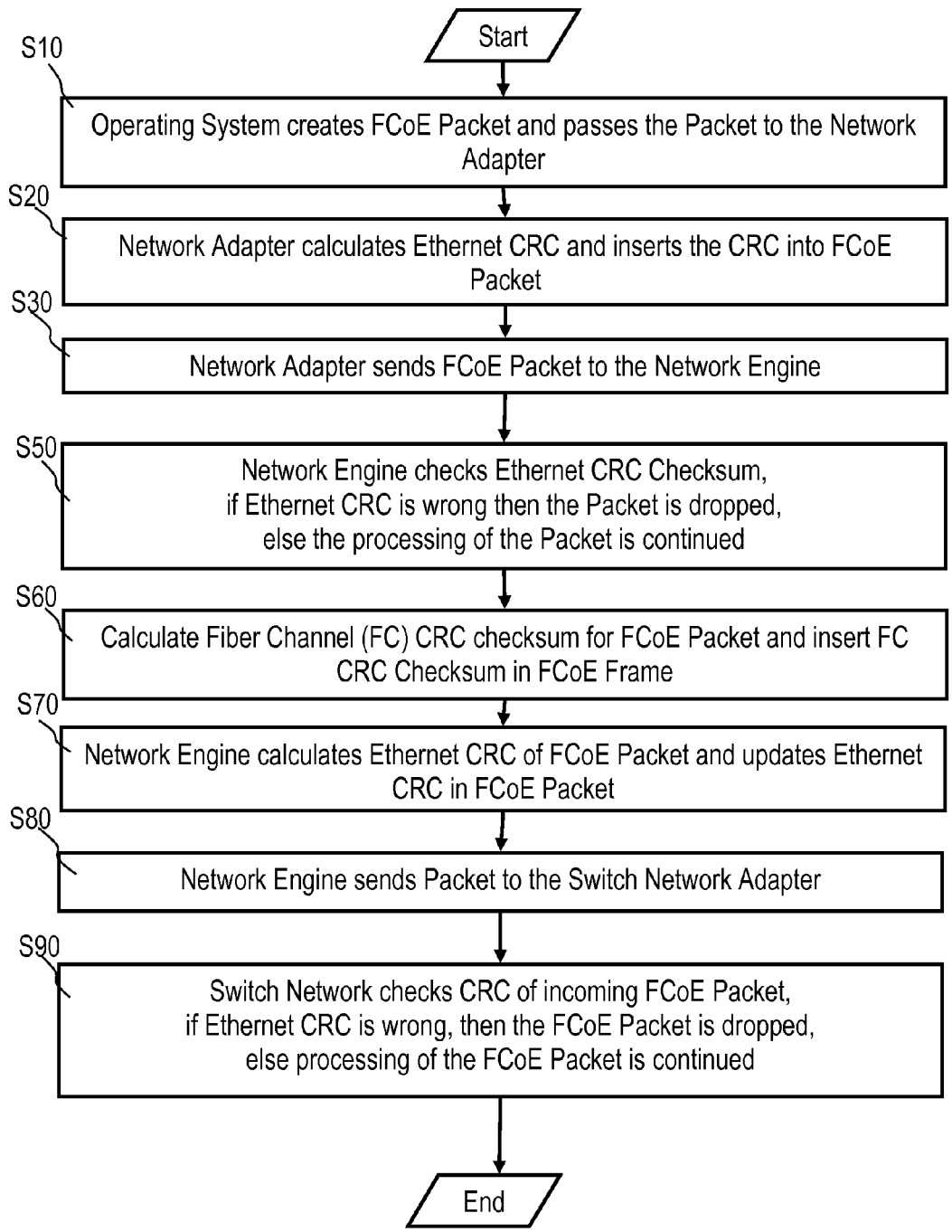
FIG. 5 is a schematic flow chart of an outbound data flow of a method for translating between a first communication protocol and a second communication protocol, in accordance with an embodiment of the present invention.

FIG. 5 is a schematic flow chart of an outbound data flow of a method for translating between a first communication protocol and a second communication protocol, in accordance with an embodiment of the present invention.

Referring to FIG. 5 the flowchart depicts how the network engine adapter 100 is working during the outbound data flow. In case of the outbound data flow the operating system 12 of the first network component 10 creates a data packet 1 of the combined communication protocol (FCoE) and passes the data packet 1 to the network adapter 14 of the first network component 10 in step S10. In step S20 the network adapter 14 calculates the Cyclic Redundancy Check CRC data 3.1 for the first communication protocol (Ethernet), wherein the network adapter 14 sends the data packet 1 of the combined communication protocol (FCoE) to the network engine adapter 100 in step S30, which is checking the Cyclic Redundancy Check (CRC) data 3.1 for the first communication protocol (Ethernet) in step S50. The network engine adapter 100 is dropping the data packet 1 of the combined communication protocol (FCoE) if the Cyclic Redundancy Check (CRC) data 3.1 for the first communication protocol (Ethernet) are wrong; else the network engine adapter 100 is continuing the processing of the data packet 1 of the combined communication protocol (FCoE). In step S60 the network engine adapter 100 is calculating Cyclic Redundancy Check (CRC) data 5.1 for the second communication protocol (CEE) and inserts the calculated Cyclic Redundancy Check (CRC) data 5.1 in the data packet 1 of the combined communication protocol (FCoE) and calculates new Cyclic Redundancy Check (CRC) data 3.1 for the first communication protocol (Ethernet), which are inserted in the data packet 1 of the combined communication protocol (FCoE) instead of the original Cyclic Redundancy Check (CRC) data 3.1. In step S80 the data packet 1 of the combined communication protocol (FCoE) is send to the second network component 30, which is checking the new Cyclic Redundancy Check (CRC) data (3.1) for the first communication protocol (Ethernet) in step S90. Additionally the second network component 30 is dropping the data packet 1 of the combined communication protocol (FCoE) if the Cyclic Redundancy Check (CRC) data 3.1 for the first communication protocol (Ethernet) are wrong, else the second network component 30 is continuing the processing of the data packet 1 of the combined communication protocol (FCoE).

Figure 6:
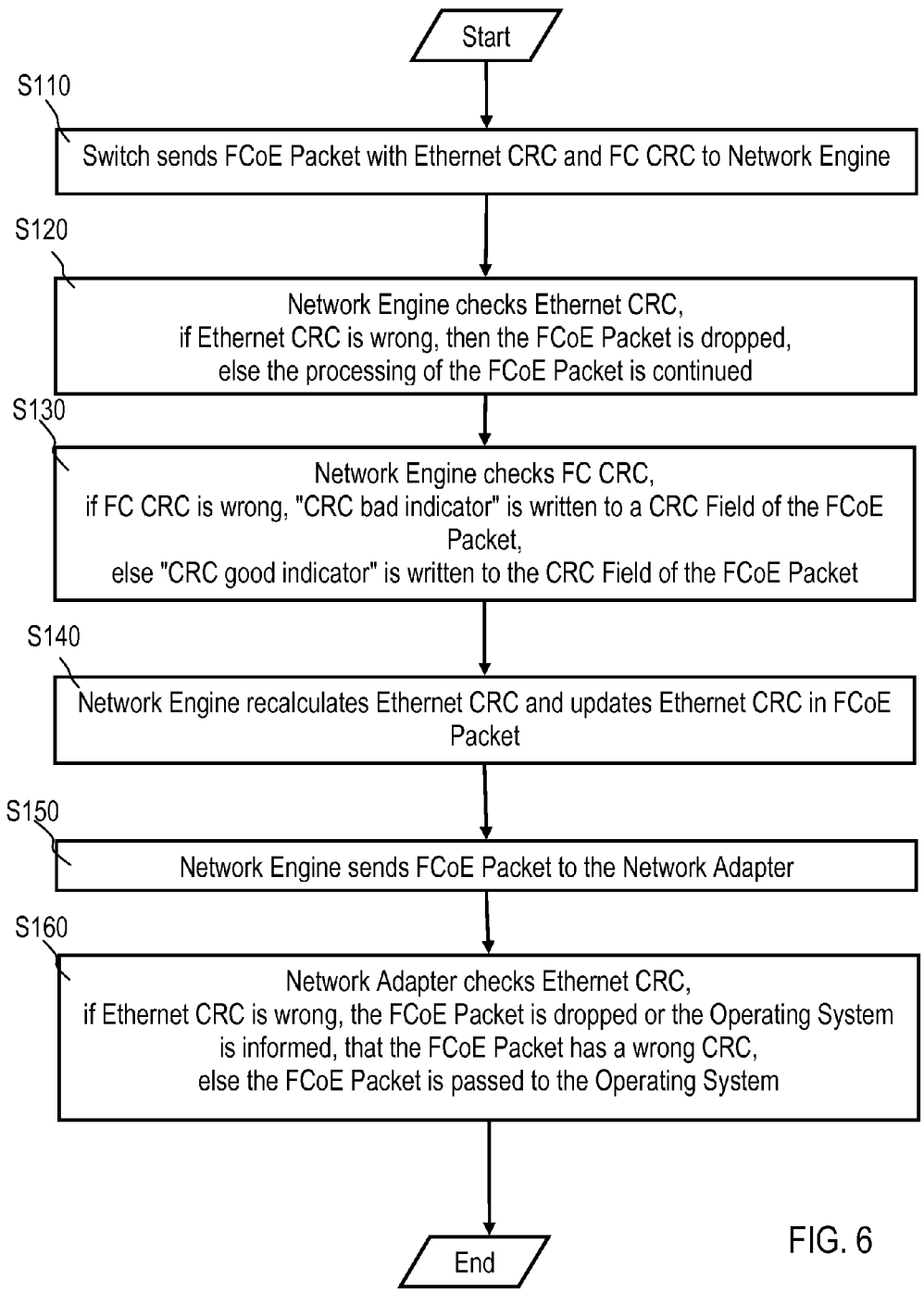
FIG. 6 is a schematic flow chart of an inbound data flow of the method for translating between a first communication protocol and a second communication protocol, in accordance with an embodiment of the present invention.

FIG. 6 is a schematic flow chart of an inbound data flow of the method for translating between a first communication protocol and a second communication protocol, in accordance with an embodiment of the present invention.

Referring to FIG. 6 the flowchart depicts how the network engine adapter 100 is working during the inbound data flow. In case of an inbound data flow the second network component 30 sends a data packet 1 of the combined communication protocol (FCoE) with Cyclic Redundancy Check (CRC) data 3.1 for the first communication protocol (Ethernet) and Cyclic Redundancy Check (CRC) data 5.1 for the second communication protocol (CEE) to the network engine adapter 100 in step S110. The network engine adapter 100 is checking the Cyclic Redundancy Check (CRC) data 3.1 for the first communication protocol (Ethernet) in step S120, wherein the network engine adapter 100 is dropping the data packet 1 of the combined communication protocol (FCoE) if the Cyclic Redundancy Check (CRC) data 3.1 for the first communication protocol (Ethernet) are wrong, else the network engine adapter 100 is continuing the processing of the data packet 1 of the combined communication protocol (FCoE). In step S130 the network engine adapter 100 is checking the Cyclic Redundancy Check (CRC) data 5.1 for the second communication protocol (CEE), wherein the network engine adapter 100 is inserting a corresponding information in a field for said Cyclic Redundancy Check (CRC) data 5.1 for the second communication protocol (CEE) indicating a status of the Cyclic Redundancy Check (CRC) data 5.1 for the second communication protocol (CEE). In step S140 the network engine adapter 100 is calculating new Cyclic Redundancy Check (CRC) data 3.1 for the first communication protocol (Ethernet), which are inserted in the data packet 1 of the combined communication protocol (FCoE) instead of the original Cyclic Redundancy Check (CRC) data 3.1. In step S150 the data packet 1 of said combined communication protocol (FCoE) is send to the network adapter 14 of the first network component 10, which is checking the new Cyclic Redundancy Check (CRC) data 3.1 for the first communication protocol (Ethernet) in step S160. The first network component 30 is dropping the data packet 1 of the combined communication protocol (FCoE) or is indicating a packet with wrong Cyclic Redundancy Check (CRC) data 3.1 if said Cyclic Redundancy Check (CRC) data 3.1 for the first communication protocol (Ethernet) are wrong, else the first network component 30 is continuing the processing of the data packet 1 of the combined communication protocol (FCoE).

Figure 7:
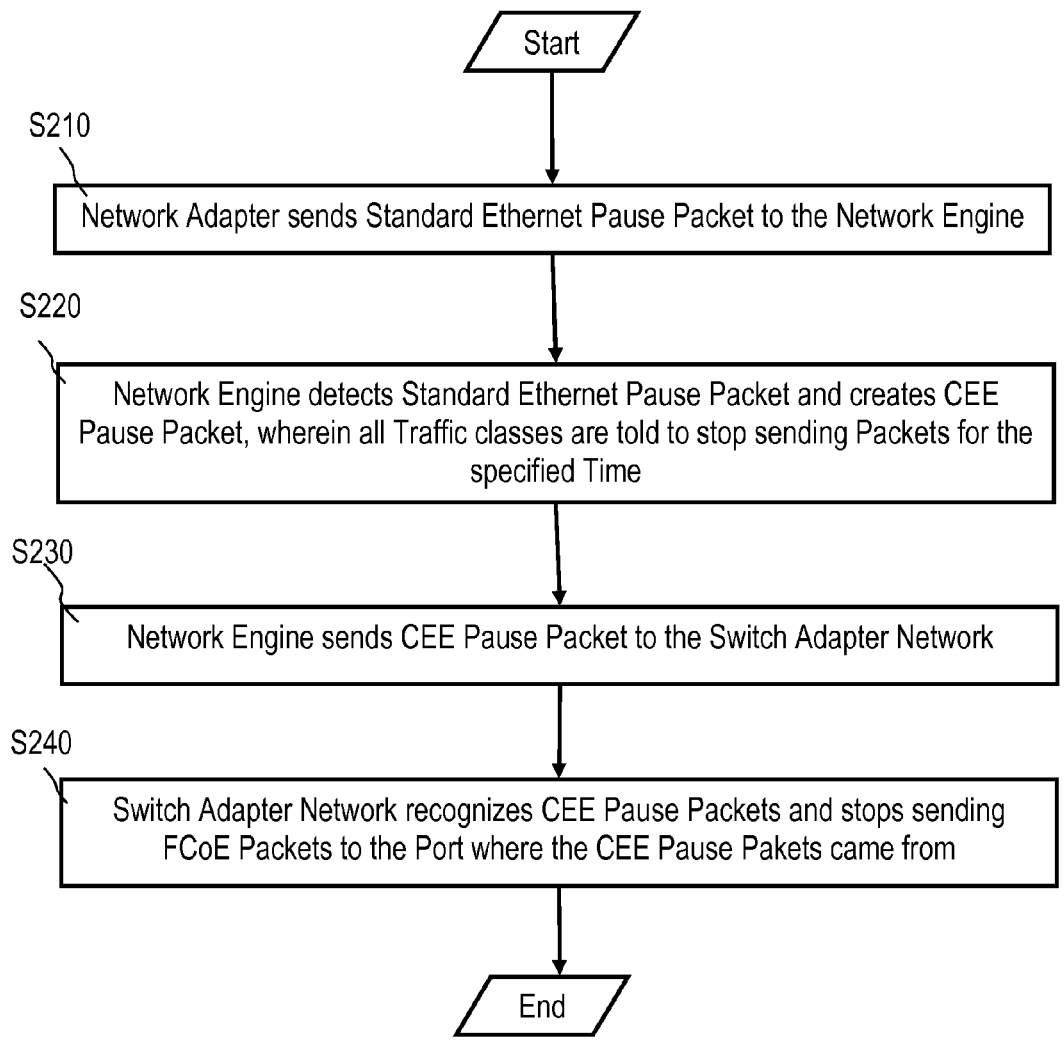
FIG. 7 is a schematic flow chart of a pause frame conversion in outbound direction of the method for translating between a first communication protocol and a second communication protocol, in accordance with an embodiment of the present invention.

FIG. 7 is a schematic flow chart of a pause frame conversion in outbound direction of the method for translating between a first communication protocol and a second communication protocol, in accordance with an embodiment of the present invention.

Referring to FIG. 7 the flowchart depicts how the network engine adapter 100 is performing a pause frame conversion during the outbound data flow. In step S210 the network adapter network sends a standard Ethernet pause packet to the network engine adapter 100. In step S220 the engine adapter 100 detects the standard Ethernet pause packet and creates pause packets for all traffic classes of the Converged Enhanced Ethernet (CEE) Protocol, wherein data traffic in all traffic classes of the CEE Protocol are told to stop sending Packets for a specified time. In Step S230 the network engine adapter 100 sends the CEE pause packets to the second network component 30. The second network component recognizes the CEE pause packets in step S240 and stops sending packets 1 of the combined data communication protocol (FCoE) to the port where the CEE pause packets came from is stopped in response.

Figure 8:
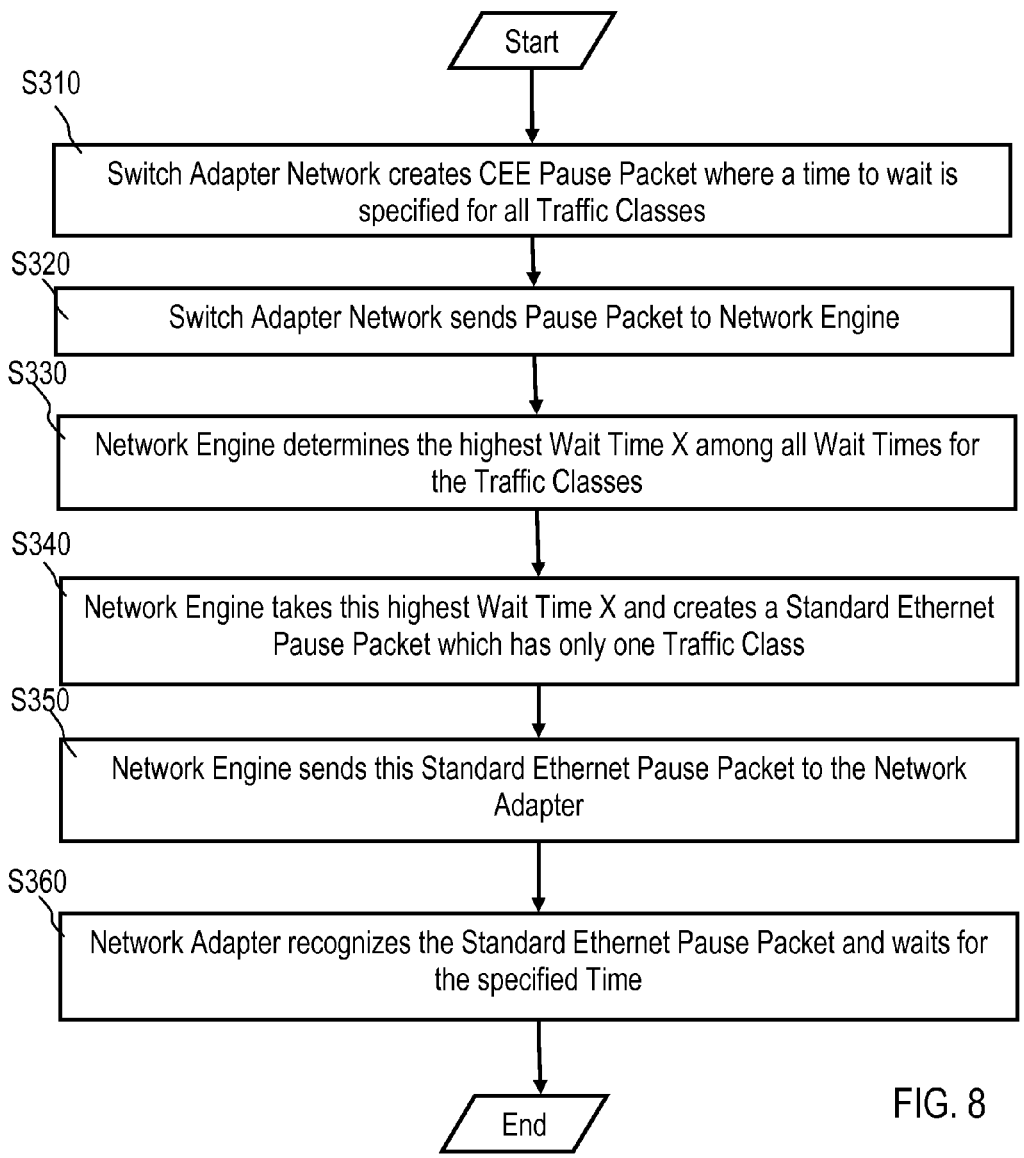
FIG. 8 is a schematic flow chart of a pause frame conversion in inbound direction of the method for translating between a first communication protocol and a second communication protocol, in accordance with an embodiment of the present invention.

FIG. 8 is a schematic flow chart of a pause frame conversion in inbound direction of the method for translating between a first communication protocol and a second communication protocol, in accordance with an embodiment of the present invention.

Referring to FIG. 8 the flowchart depicts how the network engine adapter 100 is performing a pause frame conversion during the inbound data flow. In step S310 the second network component 30 creates CEE pause packets where a time to wait is specified for all traffic classes. In step S320 the second network component 30 sends the CEE pause packets to the network engine adapter 100. In step S330 the network engine adapter 100 determines a highest wait time X among all wait times for the traffic classes. In step S340 the network engine adapter 100 takes the highest wait time X and creates a standard Ethernet pause packet which has only one traffic class. In step S350 the network engine adapter 100 sends this standard Ethernet pause packet to the network adapter 14 of the first network component 10. In step S360 the network adapter 14 of the first network component 10 recognizes the standard Ethernet pause packet and waits for the specified time.

The inventive method for translating between a first communication protocol and a second communication protocol can be implemented as an entirely software embodiment, or an embodiment containing both hardware and software elements. In some embodiments, the invention is implemented in software, which includes but is not limited to firmware, resident software, microcode, etc.

Furthermore, embodiments of the invention can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include compact disk-read only memory (CD-ROM), compact disk-read/write (CD-R/W), and DVD. A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution. Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems, and Ethernet cards are just a few of the currently available types of network adapters.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of translating between a first communication protocol used by a first network component and a second communication protocol used by a second network component the method comprising:
   receiving, by a network engine adapter operating independently from the first and second network components, data packets from the first and second network components;
   performing, by the network engine adapter, a combined communication protocol based on the first communication protocol and the second communication protocol, including manipulating data packets of at least one of the first communication protocol or the second communication protocol, thereby offloading performance requirements for the combined communication protocol from the first and second network components;
   performing, by the network engine adapter upon receipt of a data packet from the first network component, a pause packet conversion, including translating a pause packet of the first communication protocol to a pause packet of the second communication protocol data flow; and
   performing, by the network engine adapter upon receipt of a data packet from the second network component, a pause packet conversion, including translating a pause packet of the second communication protocol to a pause packet of the first communication protocol.

2. The method according to claim 1, wherein the first communication protocol comprises an Ethernet Protocol performed by a network adapter as the first network component and the second communication protocol comprises a Converged Enhanced Ethernet (CEE) Protocol performed by a switch network adapter as the second network component, wherein the performing the combined communication protocol further comprises performing a Fiber Channel over Ethernet (FCoE) Protocol.

3. The method according to claim 1, further comprising:
   performing, by the network engine adapter, computations for Cyclic Redundancy Check (CRC) data for at least one of the first communication protocol or the second communication protocol.

4. The method according to claim 3, further comprising:
   creating, by the first network component, a data packet of the combined communication protocol; calculating, by the first network component, CRC data for the first communication protocol; sending, to the network engine adapter, the data packet of the combined communication protocol;
   determining, by the network engine adapter, whether the CRC data for the first communication protocol is valid;
   if the CRC data for the first communication protocol is invalid, dropping, by the network engine adapter, the data packet of the combined communication protocol;
   if the CRC data for the first communication protocol is valid: processing, by the network engine adapter, the data packet of the combined communication protocol;
   calculating, by the network engine adapter, CRC data for the second communication protocol; inserting the calculated CRC data in the data packet of the combined communication protocol; calculating, the network engine adapter, new CRC data for the first communication protocol; replacing, by the network engine adapter, in the data packet of the combined communication protocol, the original CRC data of the first communication protocol with the new CRC data;
   and sending, by the network engine adapter, the data packet of the combined communication protocol to the second network component, determining, by the second network component, whether the new CRC data for the first communication protocol is valid;

if the new CRC data for the first communication protocol is invalid, dropping, by the second network component, the data packet of the combined communication protocol; and if the new CRC data for the first communication protocol is valid, processing, by the second network component, the data packet of the combined communication protocol.

5. The method according to claim 3, further comprising:

sending, by the second network component to the network engine adapter, a data packet of the combined communication protocol that includes CRC data for the first communication protocol and CRC data for the second communication protocol;

determining whether the CRC data for the first communication protocol is valid;

if the CRC data for the first communication protocol is invalid, dropping, by the network engine adapter, the data packet of the combined communication protocol;

if the CRC data for the first communication protocol is valid processing, by the network engine adapter, the data packet of the combined communication protocol;

checking, by the network engine adapter, the CRC data for the second communication protocol;

inserting, by the network engine adapter, corresponding information in a field for the CRC data for the second communication protocol indicating a status of the CRC data for the second communication protocol;

calculating, by the network engine adapter, new CRC data for the first communication protocol, replacing, by the network engine adapter in the data packet of the combined communication protocol, the original CRC data of the first communication protocol with the new CRC data;

sending, by the network engine adapter to the first network component, the data packet of the combined communication protocol;

determining, by the first network component, whether the new CRC data for the first communication protocol is valid;

if the new CRC data is invalid, dropping, by the first network component, the data packet of the combined communication protocol; and if the new CRC data is valid, processing, by the first network component, the data packet of the combined communication protocol.

6. The method according to claim 1, further comprising:

upon detecting, by the network engine adapter, a pause packet of the Ethernet Protocol:
  creating, by the network engine adapter, pause packets for all traffic classes of the Converged Enhanced Ethernet (CEE) Protocol; and
  stopping, by network engine adapter, data traffic in all traffic classes of the CEE Protocol; and upon detecting, by the network engine adapter, a pause packet of at least one traffic class of the CEE Protocol:
  determining, by the network engine adapter, a highest wait time;
  creating, by the network engine adapter, a pause packet of the Ethernet Protocol with the highest wait time, and
  stopping data traffic in the Ethernet Protocol for the wait time.

7. A network engine adapter arranged in a communication path between a first network component using a first communication protocol and a second network component using a second communication protocol, the network engine adapter comprising components of logic configured to carry out the steps of:

receiving, by the network engine adapter operating independently from the first and second network components, data packets from the first and second network components;

performing, by the network engine adapter, a combined communication protocol based on the first communication protocol and the second communication protocol, including manipulating data packets of at least one of the first communication protocol or the second communication protocol, thereby offloading performance requirements for the combined communication protocol from the first and second network components;

performing, by the network engine adapter upon receipt of a data packet from the first network component, a pause packet conversion, including translating a pause packet of the first communication protocol to a pause packet of the second communication protocol data flow; and performing, by the network engine adapter upon receipt of a data packet from the second network component, a pause packet conversion, including translating a pause packet of the second communication protocol to a pause packet of the first communication protocol.

8. The network engine adapter according to claim 7, wherein the network engine adapter comprises one of:
  a device independent from the first and second network components;
  a device implemented as part of the first network component; or
  a device implemented as part of the second network component.

9. The network engine adapter according to claim 7, wherein:
  the first network component performs an Ethernet Protocol;
  the second network adapter comprises a switch network adapter that performs a Converged Enhanced Ethernet Protocol; and
  performing the combined communication protocol based on the first communication protocol and the second communication protocol further comprises performing a Fiber Channel over Ethernet Protocol.

10. The network engine adapter according to claim 7, further comprising:
  a first CRC generating unit configured to carry out the steps of checking, computing, and inserting, into the data packet, Cyclic Redundancy Check (CRC) data for the second communication protocol; and
  a second CRC generating unit configured to carry out the steps of checking, computing, and inserting, into the data packet, CRC data for the first communication protocol.

11. The network engine adapter according to claim 7, wherein the network engine adapter is implemented as Field Programmable Gate Array.

12. A computer program product comprising computer program instructions for execution in a data processing system, the computer program instructions capable, when executed, of carrying out the steps of:

receiving, by a network engine adapter operating independently from a first network component and a second network component, data packets from the first and second network components;

performing, by the network engine adapter, a combined communication protocol based on a first communication protocol and a second communication protocol, including manipulating data packets of at least one of the first communication protocol or the second communication protocol, thereby offloading performance requirements for the combined communication protocol from the first and second network components;

performing, by the network engine adapter upon receipt of a data packet from the first network component, a pause packet conversion, including translating a pause packet of the first communication protocol to a pause packet of the second communication protocol data flow; and performing, by the network engine adapter upon receipt of a data packet from the second network component, a pause packet conversion, including translating a pause packet of the second communication protocol to a pause packet of the first communication protocol.

* * * * *